United States Patent [19]
Matsunaga et al.

[11] Patent Number: 5,525,547
[45] Date of Patent: Jun. 11, 1996

[54] METHOD OF FABRICATING A MOLDED SEMICONDUCTOR DEVICE HAVING BLOCKING BANKS BETWEEN LEADS

[75] Inventors: Toshihiro Matsunaga, Ome; Yuji Shirai, Hamura; Takayuki Okinaga, Hanno; Osamu Horiuchi, Akishima; Takashi Emata, Akigawa; Makoto Omata, Higashimurayama, all of Japan

[73] Assignees: Hitachi, Ltd., Tokyo; Hitachi ULSI Engineering Corporation, Kodaira, both of Japan

[21] Appl. No.: 161,374

[22] Filed: Dec. 2, 1993

[30] Foreign Application Priority Data

Dec. 16, 1992 [JP] Japan .................... 4-335909

[51] Int. Cl.⁶ .................................... H01L 21/56
[52] U.S. Cl. .................... 437/211; 437/215; 437/217; 437/220; 437/974; 156/230; 257/671
[58] Field of Search ................ 156/230; 437/211, 437/974, 215, 217, 220; 257/666, 670, 671

[56] References Cited

U.S. PATENT DOCUMENTS

| | | |
|---|---|---|
| 3,762,039 | 10/1973 | Douglass et al. . |
| 3,999,285 | 12/1976 | Lewis et al. ................. 437/217 |
| 5,064,706 | 11/1991 | Ueda et al. ................. 437/217 |
| 5,106,784 | 4/1992 | Bednarz ..................... 437/214 |
| 5,242,725 | 9/1993 | Weissmann et al. ........ 156/230 |
| 5,281,851 | 1/1994 | Mills et al. ................. 257/670 |

FOREIGN PATENT DOCUMENTS

| | | | |
|---|---|---|---|
| 56-29355 | 3/1981 | Japan . | |
| 62-114456 | 7/1987 | Japan . | |
| 3313333 | 12/1988 | Japan | 156/230 |
| 2229150 | 7/1989 | Japan . | |
| 1181555 | 7/1989 | Japan | 257/670 |
| 1232041 | 9/1989 | Japan | 156/230 |
| 4-364766 | 12/1992 | Japan . | |
| 5121618 | 5/1993 | Japan | 257/670 |
| 6069397 | 3/1994 | Japan | 257/670 |

*Primary Examiner*—George Fourson
*Assistant Examiner*—Long Pham
*Attorney, Agent, or Firm*—Pennie & Edmonds

[57] ABSTRACT

A molded semiconductor device has a plurality of slender leads formed with a sealing strip connecting them together to prevent the molding material from leaking out between the leads. Specifically, the sealing strip comprising an adhesive and an electrically insulating material is applied to the leads substantially perpendicular to the lengthwise direction of the leads. The strip is place such that an inner edge thereof substantially lies on a boundary line or inside where the molding terminates. The strip is then thrust into spaces formed between the leads. Thereafter the semiconductor chip is connected to the leads, the semiconductor chip and the leads are placed in a molding unit, the strip serving to block the molding material leaking outside the molding unit.

7 Claims, 9 Drawing Sheets

METHOD OF FABRICATING A MOLDED SEMICONDUCTOR DEVICE HAVING BLOCKING BANKS BETWEEN LEADS

BACKGROUND OF THE INVENTION

The present invention relates to a method of fabricating a molded semiconductor device and a molded semiconductor device.

Heretofore, in the molding operation in the fabrication of a molded semiconductor device, in order to prevent the injected resin from leaking to the outside from between parts of outer leads, as shown in FIG. 1, there are provided tie bars 20 each of which couples adjacent leads 16 to each other, which are formed outside a molding line ML of a lead frame 11.

That is, in the molding operation, the resin which has been injected into a cavity between molding dies is prevented from leaking out across the tie bars 0 from between the parts of the outer leads by the function of the tie bars 20.

Then, in such a lead frame 11, in order to electrically isolate the leads 16 from one another after the completion of the molding operation, the tie bars 20 need to be cut away. The method of fabricating a semiconductor device employing a lead frame having the same tie bars as those in the above-mentioned case is, for example, disclosed in U.S. Pat. No. 3,762,039 (issued on Oct. 2, 1973). In particular, refer to FIGS. 2 and 6 and the description relating thereto in the U.S. Patent.

However, in the lead frame 11 in which the interval between the leads 16 is very small, as in the lead frame 11 which is used in LSI devices having multiple pins of a fine pitch (e.g., a pitch equal to or smaller than 0.3 mm), due to a limit in fabrication of the blade for cutting the tie bars 20, a limit in accuracy of the positioning between the cutting blade and the leads during the cutting of the tie bars 20, and the like, the cutting itself of the tie bars 20 become very difficult, so that in the first place, the provision of the tie bars 20 is not practical.

In addition, in the prior art lead frame 11 as shown in FIG. 1, since in the molding operation, the resin leaks out from the outer periphery of the package, it is necessary to remove the resin thus leaked out (i.e., fins of the resin) after the completion of the molding operation. However, in the case of the slenderer leads 16, the leads 16 may be readily deformed during the removal of the fins of the resin, and the resin fins which have been separated from the package and the leads may be caught between the shaping jig and the leads to degrade the lead shaping, and/or may be attached to other parts of the leads to cause bad lead contact during the mounting of the packages. Therefore, the removal of the unnecessary part of the resin requires a troublesome process which has to be effected carefully.

On the other hand, the lead frame may be provided with, instead of the tie bars 20, a tape which is stuck on the leads of the lead frame in a direction approximately perpendicular to the lengthwise direction of the leads. In such a lead frame, too, resin fins are unnecessarily produced, which will have to be removed by the above-mentioned troublesome process. A method of employing, instead of the tie bars, the tie tapes has, for example, been proposed in JP-U-62-114456 which was laid open on Jul. 21, 1987.

SUMMARY OF THE INVENTION

Therefore, if the lead frame having no tie bar is employed, the process of removing resin fins and the process of cutting the tie bars because unnecessary and thus advantageously, the above-mentioned problems will be avoided.

It is therefore an object of the present invention to provide a technology relating to a molded semiconductor device in which a lead frame having no tie bar is employed.

According to one aspect of the present invention, a molded semiconductor device is fabricated by:

preparing a lead frame having a plurality of slender leads each having an inner lead portion to be sealed with a molding material and an outer lead portion to protrude from the molding material, the inner lead portion of the lead having a first end providing an area for electrical connection between the lead and a semiconductor chip while the outer lead portion of the lead has a second end providing an area for external electrical connection for the semiconductor chip, the outer lead portions of the leads being discontinuous from one another at locations which are outside a boundary line between the inner and outer lead portions of the leads and are other than at the second ends of the outer lead portions of the leads;

applying a strip of an adhesive and electrically insulating material to the slender leads substantially perpendicularly to a lengthwise direction of the slender leads such that an edge of the strip, which is placed nearer to the first ends of the inner lead portions of the leads than the other edge of the strip is, substantially lies on the boundary line between the inner and outer lead portions of the leads or lies more inside and that the other edge substantially lies on the boundary line or more outside;

pressing at least a portion of the strip on the slender leads so that the strip of electrically insulating material is thrust into spaces between the leads to form a blocking bank of the electrically insulating material between parts of each adjacent ones of at least the inner lead portions of the leads;

bonding a semiconductor chip to the lead frame;

effecting electrical connection between the chip and the leads;

disposing the lead frame with the blocking banks and the semiconductor chip in a molding unit in place and closing the molding unit to clamp the lead frame for a molding operation; and injecting a molding material into the molding unit with the banks serving to block the molding material from leaking outside the molding unit, thereby sealing the inner lead portions of the leads and the semiconductor chip therewith.

According to another aspect of the present invention, a molded semiconductor device includes a semiconductor chip, slender leads in electrical connection with the chip and having inner lead portions and outer lead portions and a molding material with which the inner lead portions of the leads and the chip are sealed, the outer lead portions of the leads protruding from the molding material, wherein a blocking bank of an electrically insulating material is formed between parts of each adjacent ones of at least the inner lead portions of the leads. A part of the blocking bank is sandwiched in the molding material at a peripheral edge portion of the molding material.

Thus, in the molding operation, owing to the function of the blocking bank formed in a space between the adjacent leads, the resin which is injected into a cavity between the molding dies of the molding unit can be effectively prevented from leaking to the outside from the molding dies.

In addition, although no tie bar is formed in the lead frame, in the molding operation, fins of the resin are not produced at all. Further, since the blocking bank is electrically insulating, even when the blocking banks remain in the package, sealing or molding the semiconductor chip, the leads are not electrically connected to one another at all.

DESCRIPTION OF THE PREFERRED EMBODIMENTS

Embodiment 1

Firstly, the description will hereinafter be given with respect to a structure of a lead frame according to an embodiment.

Figure 1:
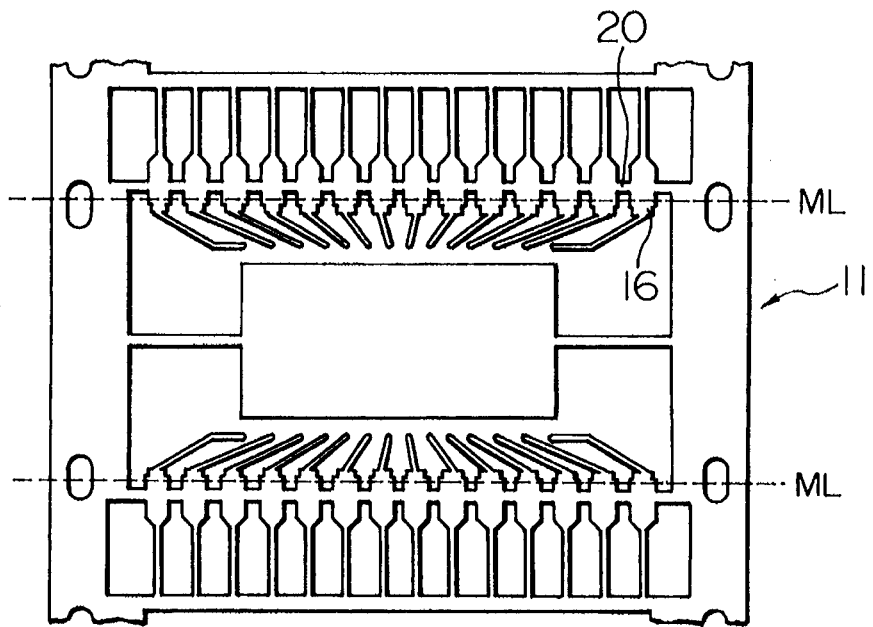
FIG. 1 is a plan view showing a structure of the prior art lead frame.
Figure 2:
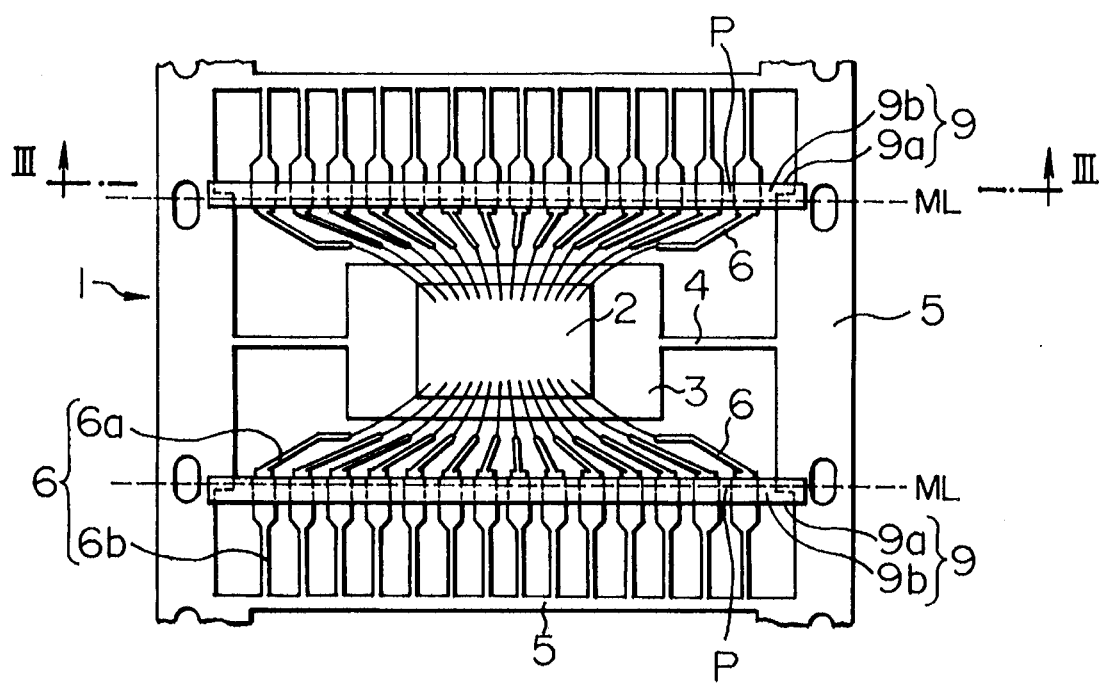
FIG. 2 is a plan view useful in explaining a state in which a strip is applied to a lead frame for use in a molded semiconductor device according to a first embodiment of the present invention.

As shown in FIG. 2, in a lead frame 1 of the present embodiment, a die pad (a tab) 3 to which a semiconductor chip 2 is bonded is located at a central portion thereof, and the die pad 3 is supported so as to be coupled to an outer frame 5 through a plurality of tab supporting leads 4. A plurality of slender leads 6 are formed approximately radially so as to extend from the outer frame 5 towards the die pad 3 such that they do not contact the die pad 3.

Each of the leads 6 has an inner lead portion 6a which is to be sealed in a molding material and an outer lead portion 6b which is to protrude from the molding material. In this connection, the inner lead portion 6a has a first end for providing an area for electrical connection between the lead 6 and the semiconductor chip 2, while the outer lead portion 6b has a second end for providing an area for electrical connection between the semiconductor chip 2 and the outside. The outer lead portions 6b of the leads 6 are discontinuous from one another at locations which are outside a boundary line (a molding line) ML between the inner and outer lead portions 6a and 6b of the leads 6 and which are other than at the portions of the outer frame 5 in the vicinity of the second ends.

An area which is defined by the die pad 3, the tab supporting leads 4 and the inner lead portions 6a of the leads 6 is an area which is to be molded with resin 6 (refer to FIG. 6) in a molding operation.

Therefore, as can be seen from FIG. 2, the dam bars (i.e., the tie bars) which were conventionally employed are not formed at all in the lead frame 1 of the present embodiment. Instead of the prior art tie bars, strips 9 are applied to portions P of the leads 6, which are to be clamped by clamps 8a of molding dies 8 (refer to FIG. 5) of the molding unit, so as to couple the adjacent leads 6 to each other.

More specifically, the strips 9 are applied to the portions P of the leads 6 substantially perpendicularly to a lengthwise direction of the leads 6 in such a way that an edge of each strip 9, which is placed nearer to the first ends of the inner lead portions 6a of the leads 6, substantially lies on the boundary line (the molding line) ML between the inner and outer lead portions 6a and 6b of the leads 6 or lies more inside that line.

Each strip 9 is, as shown in FIG. 2, made up of a base film 9a and an adhesive layer 9b which is bonded to the base film 9a. The base film 9a is made of a polyimide resin for example, and the adhesive layer 9b is made of a material which has the electrically insulating property and the heat resistance resistive to the temperatures in a molding operation, e.g., an epoxy resin. The adhesive layer 9b has a function of being able to be resistive to the injection (i.e., the injection pressure) of the resin 7 in the molding operation, which will be described in detail later.

Figure 3:
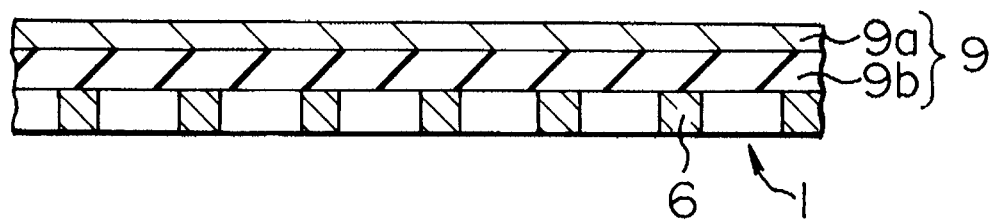
FIG. 3 is a cross sectional view taken along line III—III of FIG. 2.

In addition, as shown in FIG. 3, the thickness of the adhesive layer 9b is approximately equal to that of the lead frame 1. Further, as shown in FIG. 4, after the strip 9 has been applied to the lead frame 1, the base film 9a is removable from the adhesive layer 9b of the strip 9 due to a difference between the adhesive strength of the base film 9a to the adhesive layer 9b and that of the adhesive layer 9b to the lead frame 1.

Figure 4:
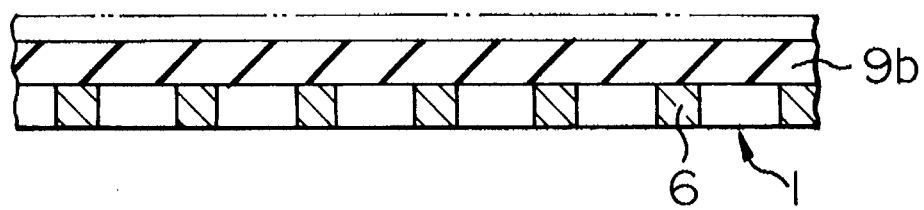
FIG. 4 is a cross sectional view showing a state in which a base film is removed from the strip applied to the lead frame shown in FIG. 3.
Figure 5:
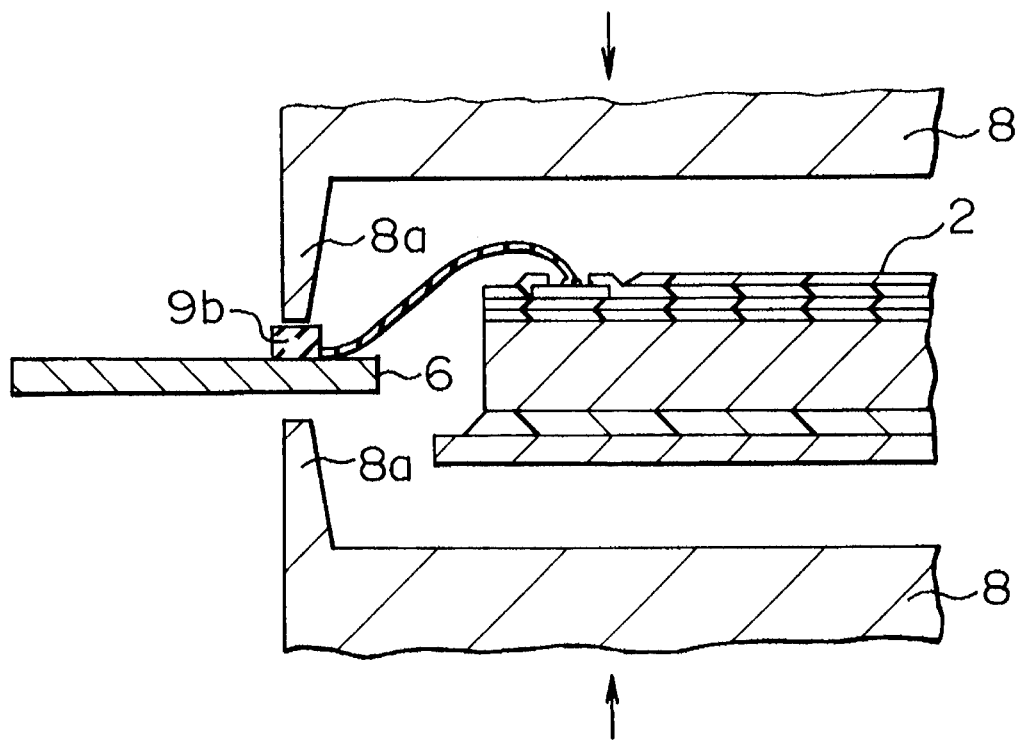
FIG. 5 is a partial cross sectional view useful in explaining the application of pressing force to the strip prior to the molding operation for the semiconductor device employing the lead frame shown in FIG. 2.

Next, as shown in FIG. 4, in the lead frame 1 to which the strip 9 has been applied, the base film 9a of the strip 9 is removed from the adhesive layer 9b, and then, as shown in FIG. 5, the resultant lead frame 1 having the adhesive layer 9b applied thereto is disposed in molding dies 8 of the molding unit in place. As a result, in the lead frame 1, only the adhesive layer 9b remains.

Figure 6:
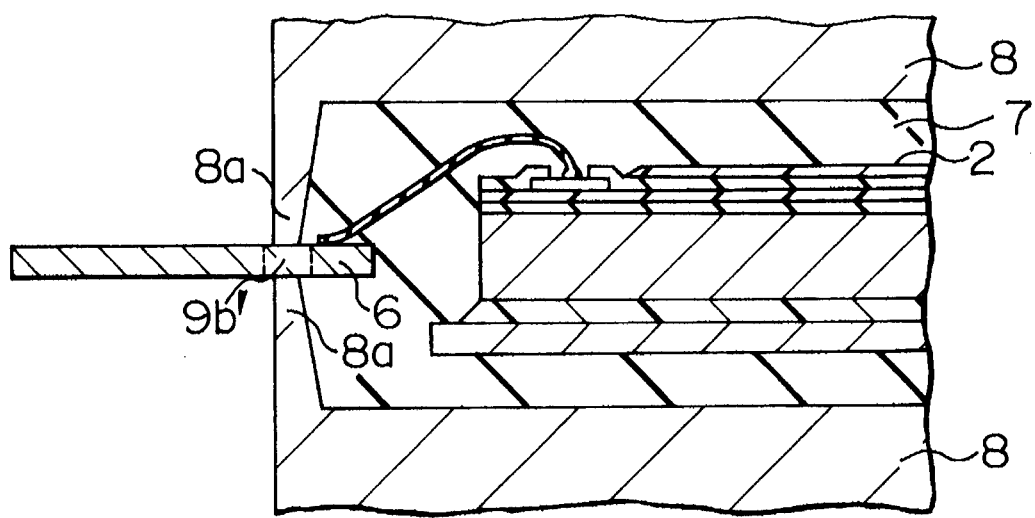
FIG. 6 is a partial cross sectional view useful in explaining the molding operation for the semiconductor device employing the lead frame shown in FIG. 2.

Next, as shown in FIG. 6, when the cope and the drag 8 as the molding dies are closed to each other, the clamps 8a of the molding dies 8 press at least parts of the adhesive layers 9b corresponding in position to the portions P of the leads 6 so that at least the parts of the adhesive layer 9b thus pressed are thrust into the spaces between the adjacent leads 6, thereby to form electrically insulating blocking banks 9b' between the adjacent leads 6. The pressing force may be, for example, about 30 tons per molding die pair and the temperature of the molding dies may be, for example, about 170° C. to 180° C.

Now, as described above, the adhesive layer 9b has the heat resistance, which is resistive to the temperatures during the molding operation, and the function of being resistive to the injection (the injection pressure) of the resin 7. Therefore, each of the blocking banks 9b', which have been formed by at least the parts of the adhesive layer 9b thrust into the spaces between the adjacent leads 6, has a function of preventing the resin 7, which has been injected during the molding operation, from leaking to the outside from the molding dies 8. In other words, the blocking banks 9b in this embodiment are made of an electrically insulating resin and serve as the conventional tie bars.

Then, the injection of the resin 7 into a cavity between the molding dies 8 has been completed and the molding dies 8 are opened again, thereby to complete the molding operation.

Figure 7:
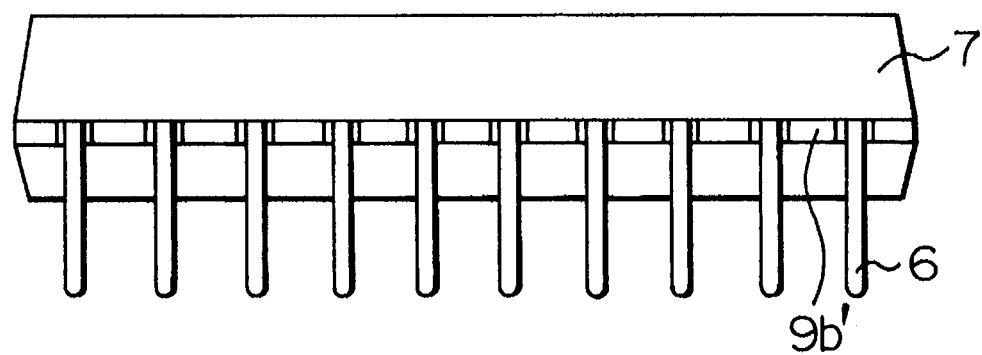
FIG. 7 is a front view of a molded semiconductor device which is fabricated by employing the lead frame of FIG. 2.

At this time, since the leakage of the resin to the outside is prevented by the blocking banks 9b' although the tie bars are not provided which were conventionally formed outside the molding line of the lead frame 1, no fin of the resin 7 is produced. In addition, since each of the blocking banks 9b' is electrically insulating, as shown in FIG. 7, even when the blocking banks 9b' remain in the completed molded semiconductor device in which the lead shaping has been completed, the leads are not electrically connected to one another.

Although the adhesive layer employed in the abovementioned embodiment is made of an epoxy resin for example, the present invention is not limited thereto or thereby. That is, various materials may be employed for the adhesive layer as long as they have an electrically insulating property, a heat resistance and viscosity resistive to the injection pressure of the resin 7. For example, a thermosetting material may also be employed.

In addition, the adhesive layer has only to have a width such that at least a part thereof are pressed by the clamps of the cope and the drag. In this case, the application of this adhesive layer to the leads may be performed in such a way that the base film as in the first embodiment is not employed but the adhesive layer is directly applied to the leads.

Further, it is, of course, to be understood that the material of the base film, which is employed in the above-mentioned embodiment, is not limited to a polyimide resin, and the various materials may be employed for the base material as long as they are removable from the adhesive layer. In addition, since the base film has been removed prior to the molding operation, it does not need particularly to have an electrically insulating property.

Incidentally, the lead frames in the present embodiments is of a dual-in-line type in which the outer lead portions are formed on the two sides confronting with each other through the die pad. However, it is, of course, to be understood that the lead frame of any other type may be employed.

Embodiment 2

Figure 8A:
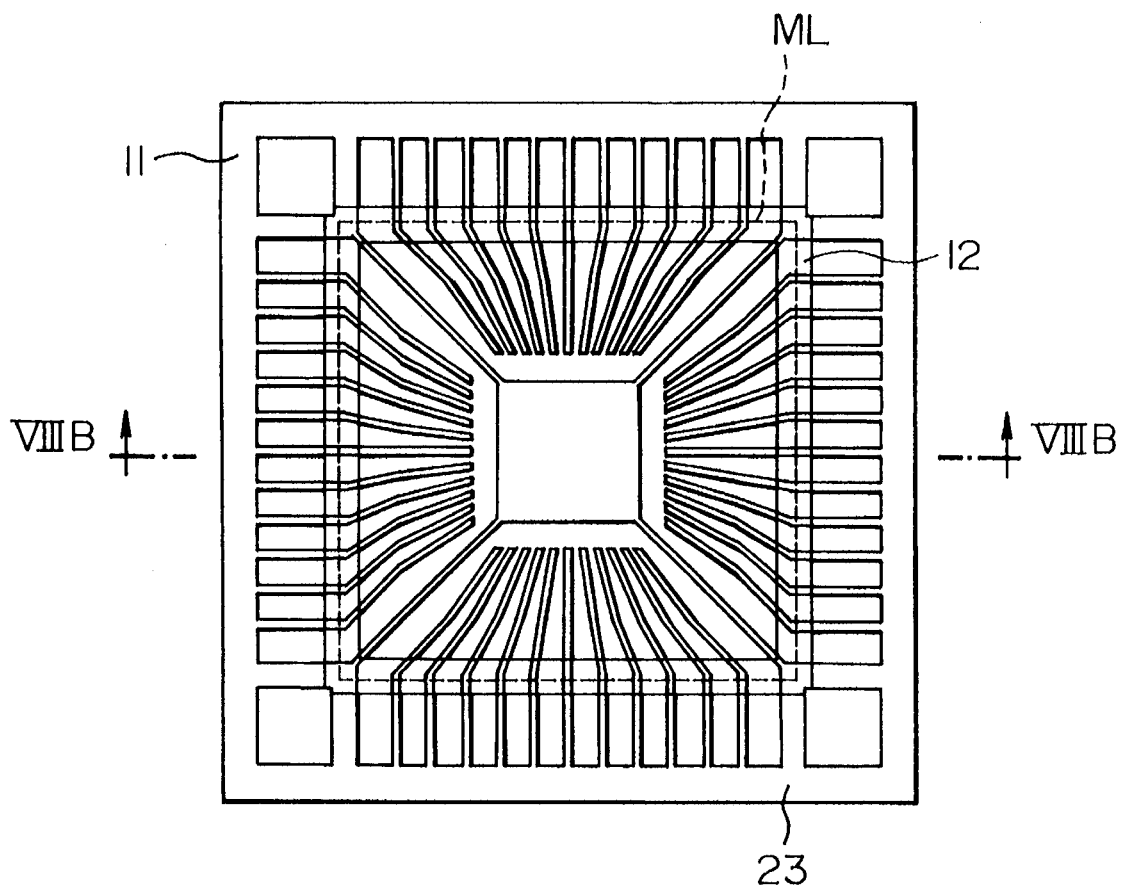
FIGS. 8A and 8B are respectively a plan view and a cross sectional view taken along line VIIIB—VIIIB of FIG. 8A each showing a state in which the strip is applied to the lead frame in the fabrication of a molded semiconductor device according to a second embodiment of the present invention.
Figure 8B:
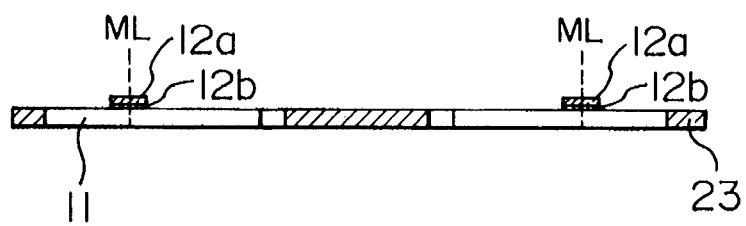

FIGS. 8A and 8B are respectively a plan view and a cross sectional view each showing a lead frame 11 having no tie bar and having a strip 12 which is provided on the lead frame 11 in the same positional relation as that in the first embodiment. The strip 12 includes, but is not limited to, a base film (a polyimide resin film) 12a which is heat resistant, electrically insulating and thermoplastic, and an adhesive layer 12b which is made of a resin (an epoxy resin) and which is heat-resistant, electrically insulating and thermosetting and is formed on the base film 12a. In the present embodiment, the strip 12 is applied to the lead frame 11 so as to be applied astride the molding line ML. FIG. 8B is a cross-sectional view taken along line VIIIB—VIIIB of FIG. 8A and shows a positional relation among the lead frame 11, the strip 12 and the molding line ML. The following description will be given mainly with respect to the similar cross-sectional views to that of FIG. 8B.

Figure 9:
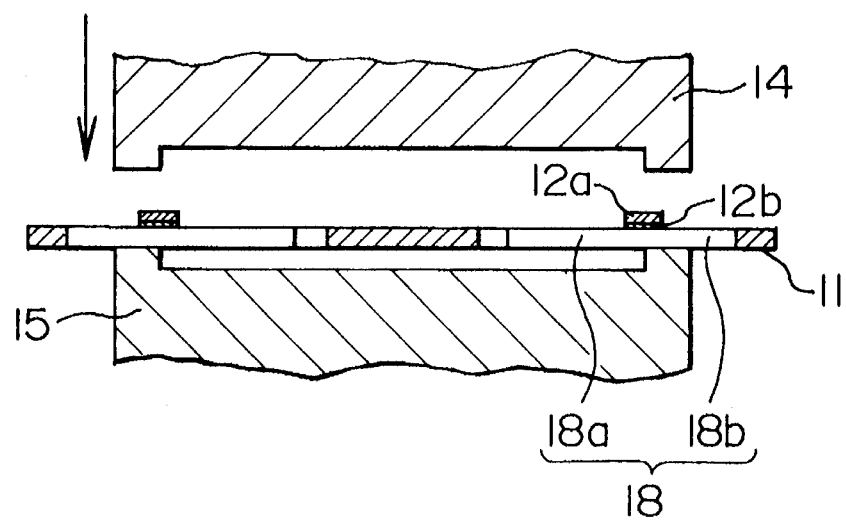
FIG. 9 is a cross sectional view showing clamping of the strip in the second embodiment of the present invention.
Figure 10A:
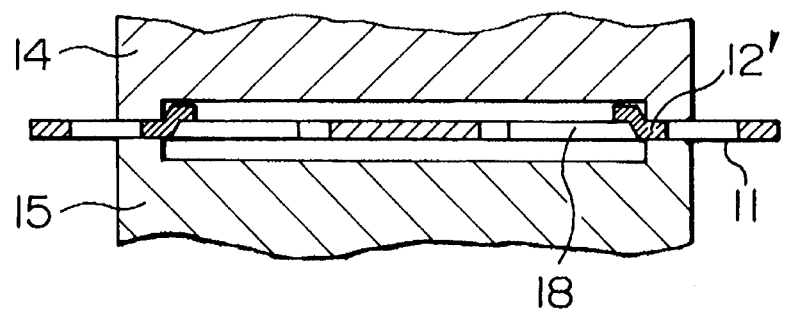
FIGS. 10A and 10B are respectively a cross sectional view and a partly enlarged sectional view each showing clamping of the strip in the second embodiment of the present invention.
Figure 10B:
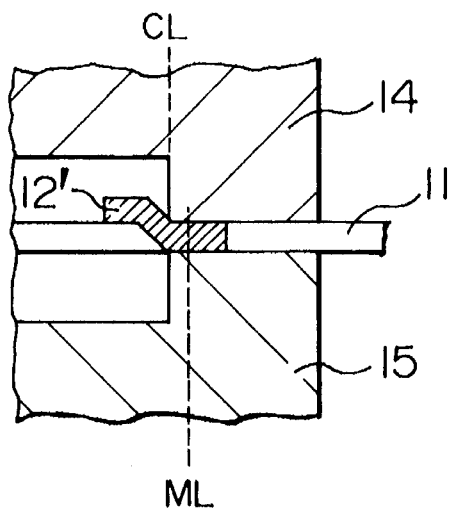

FIGS. 9, 10A and 10B show a planarization step (a preliminary clamping step) for the strip 12 applied to the lead frame 11. The lead frame 11 to which the strip 12 has been applied is disposed on a preliminary clamping die (a drag) 15 in place, which has been heated up to a temperature of about 300° C. for example. The strip 12 applied to the lead frame 11 is thus heated up to the same temperature. At this time, the adhesive layer 12b through which the strip 12 is bonded to the lead frame 11 is not changed in shape because of its thermosetting property. However, since the base film 12a of the strip 12 is thermoplastic, it softens gradually as the temperature rises.

Under this condition, the strip 12 and the lead frame 11 are clamped with a pressing force of about 1 ton per molding die pair (about one thirtieth the molding clamping force) by closing a first preliminary clamping die (a cope) 14 and a second preliminary clamping die (the drag) 15 to each other, thereby to form a blocking bank 12' having a heat resistance and an electrically insulating property in the spaces between the leads (refer to FIG. 10A). At this time, since the strip 12 has softened, the clamped parts of the strip 12 are deformed by the clamping pressure to be thrust into the spaces between the adjacent leads, with the leads 18 being not deformed at all. In the present embodiment, the heating temperature and the clamping force are respectively set to 300° C. and 1 ton/molding die pair. However, those factors should be determined on the basis of the softening property of the strip 12 such that after the completion of the clamping operation, the leads 18 are not deformed. FIG. 10B shows a positional relation among the preliminary clamping dies 14 and 15, the strip 12 and the molding line ML during the clamping operation. As can be seen from FIG. 10B, the clamps of the preliminary clamping dies 14 and 15 clamp a part of the strip 12 which is located outside the molding line ML, the area of a part of the strip which part is located outside a boundary line CL inside the molding line ML, or the whole area of the strip 12. In those figures, the reference numerals 18a and 18b designate an inner lead portion and an outer lead portion, respectively.

Figure 11:
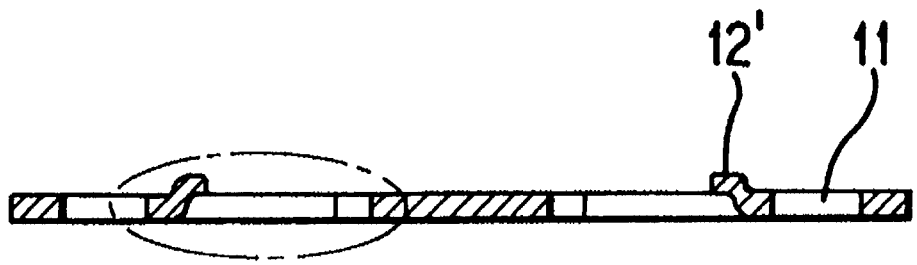
FIG. 11 is a view showing a structure of a part of blocking banks which are formed by clamping the strip in the second embodiment of the present invention.
Figure 11A:
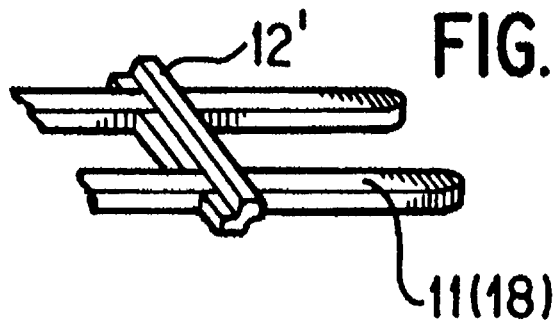
FIG. 11A is a perspective view of a portion of FIG. 11.

FIGS. 11 and 11A show a structure of the strip which is subjected to the preliminary clamping (the planarization step) by the preliminary clamping dies 14 and 15, i.e., the blocking bank 12'. As can be seen from FIG. 11A, the clamped part of the strip 12 is deformed to be thrust into the space between the adjacent leads 18 thereby to be at least partly planarized with respect to the surface of the lead frame 11. It should be noted here that since the preliminary clamping (the planarization) step is performed independently of a molding operation, both the temperature and the pressing force in the preliminary clamping operation can be set independently of both the temperature and the pressing pressure in the molding operation. In other words, with respect to the factors such as the temperature and the pressing force required for the preliminary clamping, the factors which are most suitable for the planarization, i.e., the formation of the blocking banks can be selected so as to prevent the undesirable deformation and the positional shift of the leads.

Figure 12:
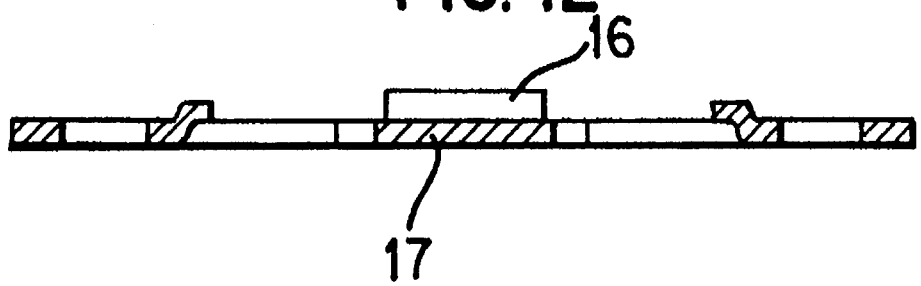
FIG. 12 is a cross sectional view showing bonding of a semiconductor chip to a die pad of the lead frame in the second embodiment of the present invention.

Next, as shown in FIG. 12, an LSI chip 16 is bonded to the die pad 17 of the lead frame 11 in which the blocking banks 12' have been formed. The method of performing the die bonding is not particularly limited as long as the temperature during the die bonding is equal to or lower than the highest temperature fulfilling the heat resistance property of the blocking banks 12' but higher than the temperature during the later molding operation.

Figure 13:
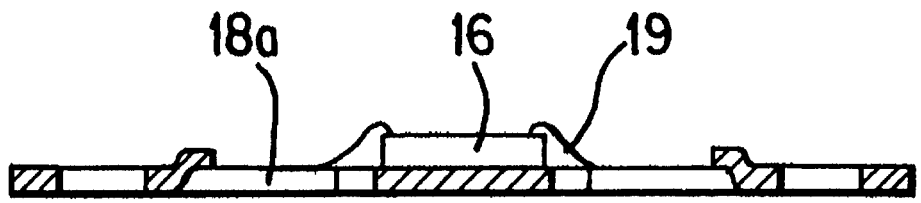
FIG. 13 is a cross sectional view showing electrical connection between the semiconductor chip and the leads through bonding wires in the second embodiment of the present invention.

After the completion of the die bonding step, as shown in FIG. 13, the terminals (the bonding pads) of the LSI chip 16 are electrically connected to the corresponding leads 18 through bonding wires 19. FIG. 13 shows a structure of one example in which the electrical connection is performed through the bonding wires 19 by using the wire bonding technology.

Figure 14:
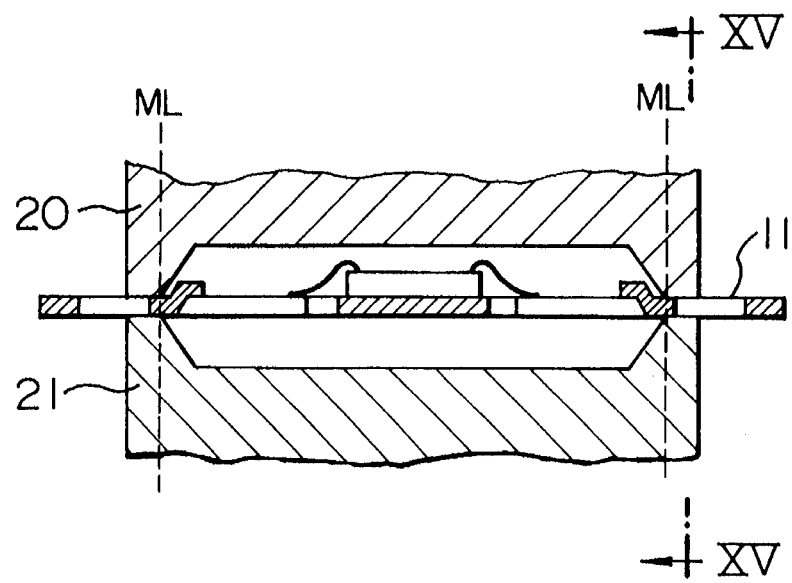
FIGS. 14, 15 and 16 are cross sectional views showing steps for a molding operation in the second embodiment of the present invention.
Figure 15:
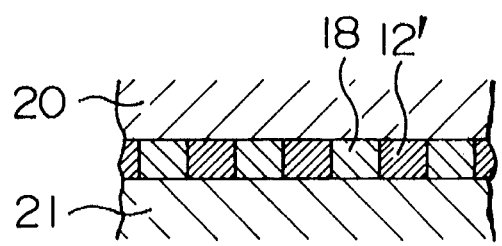
Figure 16:
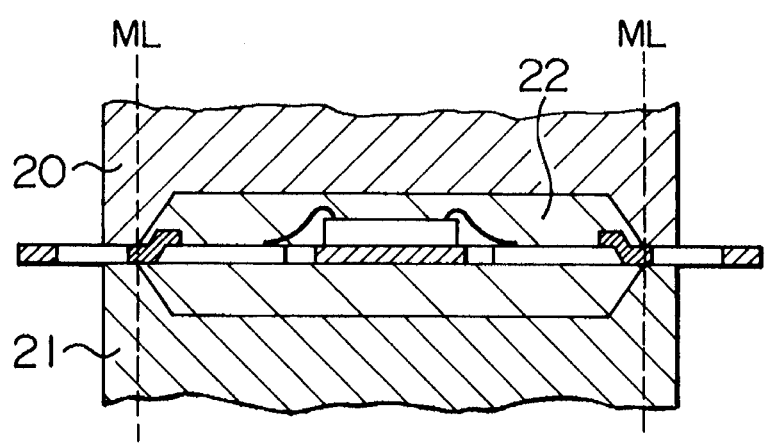

FIGS. 14, 15 and 16 are cross sectional views showing steps of a resin molding. As shown in FIG. 14, the lead frame 11 which has been electrically connected to the LSI chip 16 through the bonding wires 19 is clamped under the pressing force of 30 tons/molding die pair by closing the cope 20 and the drag 21 as the molding dies to each other which have been heated up to a temperature of about 170° C. At this time, the clamps of the molding dies clamp at least parts of the planarized portions of the blocking bank 12' formed in the lead frame 11. Namely, the lead frame 11 with the blocking bank 12' should be positioned in such a manner that each planarized portion of the blocking bank 12' astride the molding line ML, or one of the opposite edges of each planarized portion of the blocking bank 12' as viewed in the lengthwise direction of the leads is located on the molding line ML. The interest peripheries of the molding dies 20 and 21 correspond in position to the molding line ML.

Figure 17A:
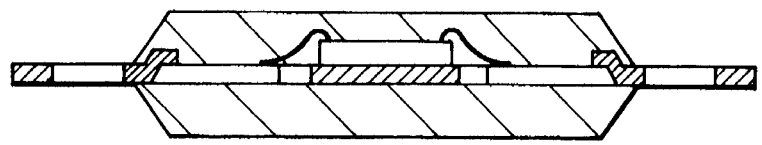
FIGS. 17A, 17B and 17C are respectively a cross sectional view, a partial perspective view and a partial plan view each showing a structure of a molded semiconductor device, after completion of the molding operation, in the second embodiment.
Figure 17B:
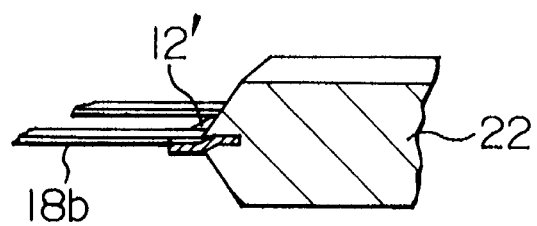
Figure 17C:
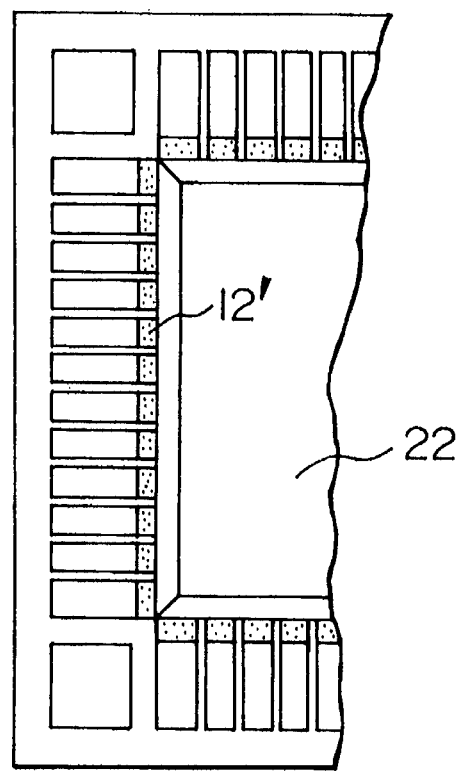

Next, as shown in FIG. 16, resin 22 is injected into a cavity between the cope 20 and the drag 21 as the molding dies to be filled therein. FIG. 15 is a partial cross sectional view, taken along line XV—XV of FIG. 14, showing a positional relation among the molding dies 20 and 21, the lead frame 11 and the blocking bank 12' during the clamping operation. Parts of the strip 12 or the whole strip 12 are thrust into the spaces between the leads 8 to form the blocking bank 12' in the lead frame 11. Then, by the function of the blocking bank 12', the resin is prevented from leaking to the outside of the molding dies during the molding operation. FIGS. 17A through 17C show a state in which the injected resin has been cured and the resultant molded semiconductor chip before separation of the outer frame and the lead shaping is taken out from the molding dies.

In the prior art, after the completion of the molding operation, it is necessary to cut the tie bars of the lead frame. However, according to the present embodiment, the blocking bank 12' need not be removed because of their electrically insulating property. Therefore, resin fins and the scraps of resin which were conventionally produced during the cutting of the tie bars are not produced at all.

Figure 18A:
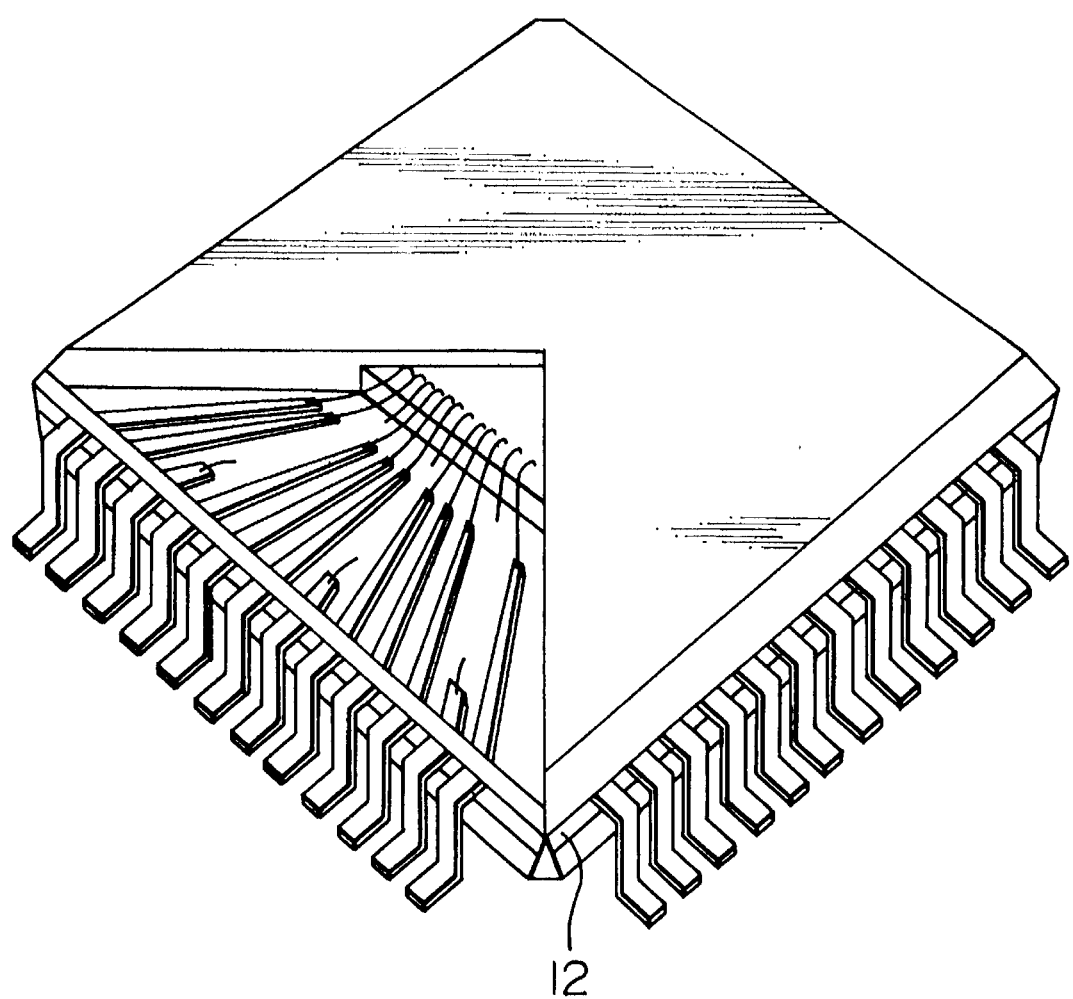
FIGS. 18A and 18B are respectively a perspective view and a cross sectional view each showing a structure of a completed molded semiconductor device in the second embodiment.
Figure 18B:
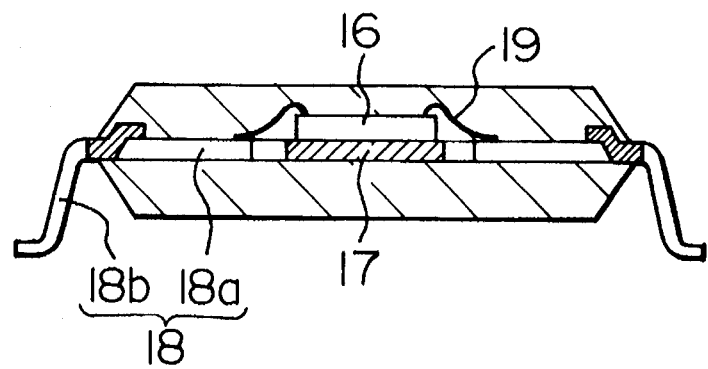

After the completion of the molding operation, an outer frame 23 of the lead frame 11 is separated, and then the outer lead portions 18b which protrude from the molding material or package are subjected to the lead shaping, and finally, the resin molded semiconductor device shown in FIGS. 18A and 18B is obtained. At this time as well, since resin fins and resin scraps are not produced at all, the good lead shaping can be performed.

In addition, in the second embodiment, the preliminary clamping is performed with the lead frame left as it is (refer to FIGS. 9, 10A and 10B), and then the fabrication of the semiconductor device of a QFP (Quad Flat Package) type is performed. However, the present invention is not limited thereto or thereby. That is, a method may also be adopted such that the preliminary clamping is performed before the completion of the molding operation, i.e., in the step after the completion of the electrical connection between the bonding pads and the leads 18 and before the completion of the molding operation.

According to the above-mentioned first and second embodiments, a part or all of the following effects can be expected.

(1) By the function of the blocking banks, during the molding operation, it is possible to prevent the injected resin from leaking to the outside from the molding dies.

(2) AS a result, although no tie bar is formed in the lead frame, there is no need to remove resin fins after the completion of the molding operation. Therefore, both the process of cutting the tie bars and the process of removing the resin fins projecting from the molding package can be omitted, and as a result, the reduction in cost can be realized.

(3) In addition, even in the lead frame in which the interval of the leads is very small, such as the lead frame which is used in a LSI device having multiple pins of a fine pitch, both the process of cutting the tie bars and the process of removing the resin fins become unnecessary in which there is the possibility that the leads may be deformed, and therefore, the molding can be readily performed.

(4) Further, since the blocking bank has the electrically insulating property, even in the case where the blocking bank remain in the molding package encapsulating the semiconductor chip, the leads are not electrically connected to one another. Therefore, after the completion of the molding operation, there is no need to remove parts of the blocking bank, if any, protruding from the molding package.

(5) Since both the process of cutting the tie bars and the process of removing the resin fins can be omitted, the semiconductor device which is advantageous in cost can be realized. In addition, the semiconductor device can be realized which is free from the deformation of the leads and is excellent in quality.

(6) The lead frame which is used in a LSI device having multiple pins of a fine pitch can be readily realized.

We claim:

1. A method of fabricating a molded semiconductor device, comprising the steps of:

preparing a lead frame having a plurality of slender leads each having an inner lead portion to be sealed with a molding material and an outer lead portion to protrude from the molding material, said inner lead portion of the lead having a first end providing an area for electrical connection between the lead and a semiconductor chip while said outer lead portion of the lead has a second end providing an area for external electrical connection for said semiconductor chip, said outer lead portions of said leads being spared apart from one another at or adjacent a boundary line between said inner and outer lead portions of the leads;

applying a strip of an adhesive and electrically insulating material having an inner longitudinal edge and an outer longitudinal edge opposite said inner edge to said slender leads, substantially perpendicularly to a lengthwise direction of said slender leads such that said inner edge of said strip, which is located nearer to said first ends, lies on or lies inside said boundary line between said inner and outer lead portions of the leads, with said outer edge lying outside or on said boundary line towards the second ends of said leads;

pressing said strip relative to said slender leads so that portions of said strip between said leads are thrusted into spaces between said leads to form a blocking bank of said electrically insulating material;

bonding a semiconductor chip to said lead frame;

electrically connecting said chip to said leads;

disposing said lead frame with said blocking bank and said semiconductor chip in a molding unit in place and closing said molding unit to clamp said lead frame for a molding operation; and injecting a molding material into said molding unit with said bank serving to block said molding material from leaking past said boundary line to outside said molding unit, thereby sealing said inner lead portions of said leads and said semiconductor chip therewith.

2. A method according to claim 1, further comprising the step of shaping said outer lead portions.

3. A method according to claim 1, wherein said strip includes an electrically insulating base film and an adhesive layer of an electrically insulating adhesive material formed on said insulating base film, and said strip applying step is performed by applying said strip to said slender leads and removing said electrically insulating base film to leave said adhesive layer as it is.

4. A method according to claim 3, wherein said base film is made of a polyimide resin and said adhesive layer is made of an epoxy resin.

5. A method according to claim 1, wherein said pressing step is performed with pressing force smaller than that with which said lead frame is clamped for said molding operation and at a temperature higher than that at which said molding material is injected.

6. A method according to claim 1, wherein said base film is made of an insulating, thermoplastic material and said adhesive layer is made of an insulating, thermosetting material.

7. A method according to claim 1, wherein said disposing step is effected such that said boundary line between said inner and outer lead portions lies on the thrusted portions of said adhesive and electrically insulating strip.

* * * * *